United States Patent
Kimura et al.

(10) Patent No.: US 7,067,228 B2
(45) Date of Patent: Jun. 27, 2006

(54) PHOTOSENSITIVE RESIN COMPOSITION, PHOTOSENSITIVE ELEMENT EMPLOYING IT, RESIST PATTERN FORMING METHOD, AND PRINTED WIRING BOARD FABRICATION METHOD

(75) Inventors: Noriyo Kimura, Hitachi (JP); Tomoaki Aoki, Hitachi (JP); Kenji Kamio, Hitachi (JP); Masaki Endou, Hitachi (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 211 days.

(21) Appl. No.: 10/311,692

(22) PCT Filed: Jun. 22, 2001

(86) PCT No.: PCT/JP01/05357

§ 371 (c)(1),
(2), (4) Date: Jul. 22, 2003

(87) PCT Pub. No.: WO01/98832

PCT Pub. Date: Dec. 27, 2001

(65) Prior Publication Data

US 2004/0101777 A1 May 27, 2004

(30) Foreign Application Priority Data

Jun. 22, 2000 (JP) .......................... 2000-187819

(51) Int. Cl.
*G03F 7/00* (2006.01)

(52) U.S. Cl. .............. 430/270.1; 430/281.1; 430/286.1; 430/313; 430/320; 430/323; 430/324; 430/325

(58) Field of Classification Search .......... 430/270.1, 430/286.1, 281.1, 313, 320, 323, 324, 325
See application file for complete search history.

(56) References Cited

U.S. PATENT DOCUMENTS 5,922,509 A 7/1999 Kautz et al.

FOREIGN PATENT DOCUMENTS

| JP | 63-184744 | | | 7/1988 |
|---|---|---|---|---|
| JP | 05-341527 | | | 12/1993 |
| JP | 06242603 | A | * | 9/1994 |
| JP | 06-242603 | | | 9/1994 |
| JP | 07-319153 | | | 12/1995 |
| JP | 11184081 | A | * | 7/1999 |
| JP | 11-223944 | | | 8/1999 |
| JP | 11-327137 | | | 11/1999 |
| JP | 2001159817 | A | * | 6/2001 |

OTHER PUBLICATIONS

Machine Translations of JP 06–242603, and JP 2001–159817.*
Chinese Office Action, received Aug. 20, 2004.
JP11327137A2: English Abstract by Delphion, www.delphion.com, 2 pages.
Office Action from the Taiwanese Patent Office, 3 pages, issued on Mar. 9, 2004.

* cited by examiner

*Primary Examiner*—Amanda Walke
(74) *Attorney, Agent, or Firm*—Griffin & Szipl, P.C.

(57) ABSTRACT

A photosensitive resin composition which comprises (A) a binder polymer, (B) a photopolymerizing compound having at least one ethylenic unsaturated bond in the molecule and (C) a photopolymerization initiator, wherein the binder polymer as component (A) comprises two or more binder polymers and/or has a dispersity of 2.5–6.0, and wherein the photopolymerizing compound as component (B) has in the molecule at least one ethylene glycol chain and at least one $C_3$–$C_6$ alkylene glycol chain.

47 Claims, No Drawings

PHOTOSENSITIVE RESIN COMPOSITION, PHOTOSENSITIVE ELEMENT EMPLOYING IT, RESIST PATTERN FORMING METHOD, AND PRINTED WIRING BOARD FABRICATION METHOD

TECHNICAL FIELD

The present invention relates to a photosensitive resin composition, a photosensitive element employing it, a resist pattern forming method and a printed wiring board fabrication method.

BACKGROUND ART

Photosensitive elements obtained using photosensitive resin compositions with supports and protective films are widely used in the field of printed wiring board fabrication as resist materials for etching, plating and the like.

The two processes of tenting and plating are used for fabrication of printed wiring boards. Tenting is a method in which copper through holes for interlayer connection are protected with a resist and an electrical circuit is formed by etching and resist stripping, while plating is a method in which copper is deposited in the through holes by electroplating and protected by solder plating, and an electrical circuit is formed by resist stripping and etching.

Since tenting does not entail the steps of degreasing, substrate cleaning, acid washing, activation, etc. or involve prolonged contact of the resist with strongly acidic or strongly basic aqueous solutions, as is typical of plating, it is industrially useful in allowing avoidance of unwanted troubles that can occur with fabrication of printed wiring boards, and for simplifying the process.

When forming electrical circuits by such tenting methods, the following properties are required for the photosensitive resin composition:

(i) The film strength must be sufficient to withstand the spray pressure of the developing solution or cleaning water, (ii) the resist must have a shape sufficient to obtain the desired line width for etching, and (iii) fine strips must be produced by the stripping.

Stripping is usually accomplished with an automatic stripping machine, but when the strips are large they become tangled on the roll of the stripper, thereby not only significantly impairing the operation efficiency but also occasionally readhering to the clean substrate, and therefore fine strips are preferred. From the standpoint of line precision, the resist shape is preferably such that the resist is perpendicular without pitting in the resist wall at the interface between the resist and the copper surface. A trapezoidal resist shape will hinder achievement of high resolution, while an inverted trapezoidal shape will result in a relatively small contact area with the copper surface, thereby lowering adhesion of the resist during etching.

Particularly in the case of an alkali developing-type photosensitive resin composition, the size of the strips, the resist shape and the tent film strength will be determined by the composition and molecular weight of the binder polymer used in the photosensitive resin composition, and the strips will tend to be smaller with a lower molecular weight of the binder polymer and greater hydrophilicity of the composition. On the other hand, the resist shape will tend to be less suitable with a lower molecular weight of the binder polymer and greater hydrophilicity of the composition, with pitting appearing in the resist side walls. The tent film strength will tend to be lower with a lower molecular weight of the binder polymer and greater hydrophilicity of the composition, with breaks tending to occur in the tent film by the spray pressure of the developing solution or cleaning water.

The prior art has therefore not yet provided a photosensitive resin composition which gives a satisfactory resist shape and high tent film strength and resulting in fine strips. Consequently, even when a photosensitive resin composition with a satisfactory resist shape and high tent film strength is selected, large strips tend to result and become tangled onto the roll, and such strips must be removed from the roll several times each day.

DISCLOSURE OF THE INVENTION

The present invention has been accomplished in light of the aforementioned problems of the prior art, and its object is to provide a photosensitive resin composition and a photosensitive element with an excellent balance between resist shape, tent reliability and stripping property, which is therefore useful for high densification of printed wiring and automation of printed wiring board fabrication.

It is another object of the invention to provide a resist pattern production method and printed wiring board fabrication method wherein a photosensitive resin composition and photosensitive element with excellent balance between resist shape, tent reliability and stripping property is used to allow higher densification of printed wiring and more efficient automation of printed wiring board fabrication.

As a result of much diligent research directed toward achieving the aforementioned objects, the present inventors have completed the present invention upon discovering that the problems described above can be overcome by a photosensitive resin composition comprising (A) a binder polymer, (B) a photopolymerizing compound having at least one ethylenic unsaturated bond in the molecule and (C) a photopolymerization initiator, wherein the binder polymer comprises two or more binder polymers and/or has a dispersity of 2.5–6.0, and wherein the photopolymerizing compound has in the molecule at least one ethylene glycol chain and at least one alkylene glycol chain selected from the group consisting of $C_3$–$C_6$ alkylene glycol chains.

In other words, the photosensitive resin composition of the invention is a photosensitive resin composition comprising (A) a binder polymer, (B) a photopolymerizing compound having at least one ethylenic unsaturated bond in the molecule and (C) a photopolymerization initiator, wherein the binder polymer as component (A) comprises two or more binder polymers and the photopolymerizing compound as component (B) has in the molecule at least one ethylene glycol chain and at least one alkylene glycol chain selected from the group consisting of $C_3$–$C_6$ alkylene glycol chains.

Alternatively, the photosensitive resin composition of the invention is a photosensitive resin composition comprising (A) a binder polymer, (B) a photopolymerizing compound having at least one ethylenic unsaturated bond in the molecule and (C) a photopolymerization initiator, wherein the binder polymer as component (A) has a dispersity of 2.5–6.0 and the photopolymerizing compound as component (B) has in the molecule at least one ethylene glycol chain and at least one alkylene glycol chain selected from the group consisting of $C_3$–$C_6$ alkylene glycol chains.

The photosensitive element of the invention is prepared by coating and drying the aforementioned photosensitive resin composition of the invention onto a support.

The resist pattern forming method of the invention is a method wherein the aforementioned photosensitive element of the invention is laminated onto a circuit forming board with the photosensitive resin composition layer bonded thereto and is irradiated with an activating light beam in an image pattern for photocuring of the exposed sections, and the unexposed sections are removed by development.

The printed wiring board fabrication method of the invention is a method wherein a circuit forming board on which a resist pattern has been formed by the aforementioned resist pattern forming method of the invention is subjected to etching treatment or plating treatment.

According to the invention, the photopolymerizing compound as component (B) preferably has at least 15 $C_2$–$C_6$ alkylene glycol units and/or has a molecular weight of 900 or greater. The photopolymerizing compound as component (B) also preferably has at least one ethylene glycol chain and at least one propylene glycol chain in the molecule.

Also according to the invention, the binder polymer as component (A) preferably contains at least one selected from the group consisting of styrene and styrene derivatives, as an essential copolymerizing component.

Also according to the invention, the photopolymerizing compound as component (B) is preferably a polyalkyleneglycol di(meth)acrylate or a 2,2-bis(4-((meth)acryloxypolyalkoxy)phenyl) propane.

Also according to the invention, the photopolymerization initiator as component (C) preferably contains a 2,4,5-triarylimidazole dimer as an essential component.

The present application claims convention priority based on Japanese Patent Application No. 2000-187819, the content of which is incorporated into the present application by reference.

BEST MODE FOR CARRYING OUT THE INVENTION

The present invention will now be explained in further detail. Throughout the present specification, the term "(meth)acrylic acid" refers to acrylic acid and its corresponding methacrylic acid, the term "(meth)acrylate" refers to acrylate and its corresponding methacrylate, and the term "(meth)acryloyl group" refers to an acryloyl group and its corresponding methacryloyl group.

The feature of the first photosensitive resin composition of the invention is that it is a photosensitive resin composition comprising (A) a binder polymer, (B) a photopolymerizing compound having at least one ethylenic unsaturated bond in the molecule and (C) a photopolymerization initiator, wherein the binder polymer as component (A) comprises two or more binder polymers and the photopolymerizing compound as component (B) has in the molecule at least one ethylene glycol chain and at least one alkylene glycol chain selected from the group consisting of $C_3$–$C_6$ alkylene glycol chains.

The feature of the second photosensitive resin composition of the invention is that it is a photosensitive resin composition comprising (A) a binder polymer, (B) a photopolymerizing compound having at least one ethylenic unsaturated bond in the molecule and (C) a photopolymerization initiator, wherein the binder polymer as component (A) has a dispersity of 2.5–6.0 and the photopolymerizing compound as component (B) has in the molecule at least one ethylene glycol chain and at least one alkylene glycol chain selected from the group consisting of $C_3$–$C_6$ alkylene glycol chains.

The binder polymer used as component (A) according to the invention will be explained first.

The two or more binder polymers for the binder polymer used as component (A) in the first photosensitive resin composition are not particularly restricted so long as they are a combination of two or more different binder polymers, but they are preferably a combination of 2–4 different binder polymers, more preferably a combination of 2–3 different binder polymers and most preferably a combination of 2 different binder polymers. As the two or more (two or more different) binder polymers there may be mentioned, for example, two or more different binder polymers with different copolymerizing components, two or more different binder polymers with different weight-average molecular weights, or two or more different binder polymers with different dispersities. When the binder polymer consists of a single binder polymer, the resulting photosensitive resin composition will be inferior in at least one of the properties of resist shape, tent reliability and stripping property, unless the dispersity is between 2.5 and 6.0, as will be explained hereunder. On the other hand, when the binder polymer consists of two or more binder polymers, a photosensitive resin composition with excellent balance between all of the properties of resist shape, tent reliability and stripping property is obtained, and it is possible to efficiently and reliably obtain a binder polymer with a dispersity of 2.5–6.0, as will be explained hereunder.

As a preferred example of a combination of two different binder polymers with different weight-average molecular weights there may be mentioned a combination of a binder polymer with a weight-average molecular weight of about 10,000 to 75,000 and a binder polymer with a weight-average molecular weight of about 80,000 to 200,000. According to the invention, the weight-average molecular weight is the value calculated based on a standard polystyrene calibration curve after measurement by gel permeation chromatography.

As examples of two different binder polymers with different copolymerizing components there may be mentioned as preferable a blend of two of the following copolymer A, a blend of two of the following copolymer B, and a blend of the following copolymer A and copolymer B.

Copolymer A: A copolymer of (meth)acrylic acid and one or more alkyl (meth)acrylates.

Copolymer B: A copolymer of (meth)acrylic acid, one or more alkyl (meth)acrylates, and styrene.

As an example of two different binder polymers with different dispersities there may be mentioned a combination of a binder polymer with a dispersity of 1.5–2.5 and a binder polymer with a dispersity of 3.5–4.5.

The dispersity of the binder polymer used as component (A) in the second photosensitive resin composition is not particularly restricted so long as it is between 2.5 and 6.0, but it is preferably 2.7–6.0, more preferably 3.0–6.0, even more preferably 3.0–5.5, yet more preferably 3.0–5.0, yet even more preferably 3.0–4.5, and most preferably 3.0–4.0. If the dispersity of the binder polymer of the invention is below this range it becomes difficult to achieve both tent reliability and stripping property (in particular the stripping property is impaired), while if it is greater than this range, the tent reliability and resolution are impaired.

The dispersity according to the invention is the value of the weight-average molecular weight/number-average molecular weight, where the weight-average molecular weight and number-average molecular weight are calculated using a standard polystyrene calibration curve after measurement by gel permeation chromatography.

The binder polymer with a dispersity of between 2.5 and 6.0 may be obtained, for example, by blending two different binder polymers with different weight-average molecular weights (preferably a binder polymer with a weight-average molecular weight of about 10,000 to 75,000 and a binder polymer with a weight-average molecular weight of about 80,000 to 200,000). By using a polymer with a multimode molecular weight distribution as described in Japanese Unexamined Patent Publication HEI No. 11-327137, it is possible to adjust the dispersity of one type of binder polymer to between 2.5 and 6.0.

As examples of binder polymers there may be mentioned acrylic resins, styrene resins, epoxy resins, amide resins, amidoepoxy resins, alkyd resins and phenol resins. From the standpoint of the alkali developing property, an acrylic resin is preferred. Such binder polymers may be used alone or in combinations of two or more.

The binder polymer may be produced, for example, by radical polymerization of a polymerizable monomer.

As examples of polymerizable monomers there may be mentioned polymerizable styrene derivatives such as styrene, vinyltoluene, α-methylstyrene, p-methylstyrene, p-ethylstyrene, p-methoxystyrene, p-ethoxystyrene, p-chlorostyrene and p-bromostyrene, as well as acrylamide, acrylonitrile, vinyl alcohol esters such as vinyl-n-butyl ether, alkyl (meth)acrylates, tetrahydrofurfuryl (meth)acrylate, dimethylaminoethyl (meth)acrylate, diethylaminoethyl (meth)acrylate, glycidyl (meth)acrylate, 2,2,2-trifluoroethyl (meth)acrylate, 2,2,3,3-tetrafluoropropyl (meth)acrylate, (meth)acrylic acid, α-bromo(meth)acrylic acid, α-chloro (meth)acrylic acid, β-furyl(meth)acrylic acid, β-styryl (meth)acrylic acid, maleic acid, maleic anhydride, maleic acid monoesters such as monomethyl maleate, monoethyl maleate, and monoisopropyl maleate, fumaric acid, cinnamic acid, α-cyanocinnamic acid, itaconic acid, crotonic acid, propiolic acid, and the like. These may be used alone or in combinations of two or more.

As examples of alkyl (meth)acrylates there may be mentioned compounds represented by the following general formula:

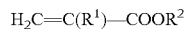

(where $R^1$ represents hydrogen or methyl group and $R^2$ represents $C_1$–$C_{12}$ alkyl group), and the same compounds wherein the alkyl group is substituted with a hydroxyl, epoxy, halogen or the like. As $C_1$–$C_{12}$ alkyl groups represented by $R^2$ in the general formula there may be mentioned methyl, ethyl, propyl, butyl, pentyl, hexyl, heptyl, octyl, nonyl, decyl, undecyl, dodecyl and their structural isomers.

As examples of alkyl (meth)acrylates there may be mentioned methyl (meth)acrylate, ethyl (meth)acrylate, propyl (meth)acrylate, butyl (meth)acrylate, pentyl (meth)acrylate, hexyl (meth)acrylate, heptyl (meth)acrylate, octyl (meth) acrylate, 2-ethylhexyl (meth)acrylate and their structural isomers. These may be used alone or in combinations of two or more.

The binder polymer used as component (A), from the standpoint of the alkali developing property, preferably contains a carboxyl group in at least one of the binder polymers, and more preferably contains a carboxyl group in all of the binder polymers. A binder polymer with a carboxyl group can be produced by, for example, radical polymerization of a polymerizable monomer with a carboxyl group and another polymerizable monomer. Methacrylic acid is preferred as the polymerizable monomer with a carboxyl group.

From the standpoint of flexibility, the binder polymer used as component (A) preferably contains styrene or a styrene derivative as a polymerizable monomer in at least one of the binder polymers. In order to achieve both satisfactory adhesion and stripping property with addition of styrene or a styrene derivative as a copolymerizing component, the styrene or styrene derivative is preferably added at 0.1–40 wt %, more preferably 1–28 wt % and even more preferably 1.5–27 wt % with respect to the total copolymerizing components of the binder polymer. If the content is less than 0.1 wt %, the adhesion will tend to be inferior, while if it exceeds 40 wt %, the sizes of the strips increase and the stripping time tends to be longer.

From the standpoint of balance between alkali developing property and alkali resistance, the carboxyl group content in the entire binder polymer used as component (A) (the proportion of carboxyl group-containing polymerizable monomer with respect to the total polymerizable monomer used) is preferably 12–50 wt %, more preferably 12–40 wt %, even more preferably 15–30 wt % and most preferably 15–25 wt %. The alkali developing property tends to be inferior when the carboxyl group content is less than 12 wt %, while the alkali resistance tends to be inferior when the content is greater than 50 wt %.

From the standpoint of balance between mechanical strength and alkali developing property, the weight-average molecular weight of the total binder polymer used as component (A) is preferably 20,000–300,000, more preferably 40,000–200,000 and even more preferably 60,000–120,000. The mechanical strength tends to be inferior when the weight-average molecular weight is less than 20,000, while the alkali developing property tends to be inferior when it is greater than 300,000.

The photopolymerizing compound used as component (B) according to the invention will now be explained.

In the photosensitive resin composition of the invention, component (B) contains a photopolymerizing compound with at least one ethylenic unsaturated bond in the molecule, wherein the photopolymerizing compound has in the molecule at least one ethylene glycol chain and one alkylene glycol chain selected from the group consisting of $C_3$–$C_6$ alkylene glycol chains.

As examples of $C_3$–$C_6$ alkylene glycol chains according to the invention there may be mentioned propylene glycol chains (n-propylene glycol chains and isopropylene glycol chains), n-butylene glycol chains, isobutylene glycol chains, n-pentylene glycol chains, hexylene glycol chains and their structural isomers, with propylene glycol chains being preferred from the standpoint of hydrophobic balance, availability, etc.

The photopolymerizing compound according to the invention has at least one ethylenic unsaturated bond in the molecule, but from the standpoint of tenting property and stripping property it preferably has 2 or more and more preferably 2 such bonds.

There are no particular restrictions on the photopolymerizing compound having in the molecule at least one ethylene glycol chain and one propylene glycol chain, so long as it has in the molecule at least one ethylene glycol chain and one propylene glycol chain, and as examples there may be mentioned polyalkyleneglycol di(meth)acrylates having in the molecule at least one ethylene glycol chain and one propylene glycol chain, 2,2-bis(4-((meth)acryloxypolyalkoxy)phenyl) propanes having in the molecule at least one ethylene glycol chain and one propylene glycol chain, urethane bond-containing (meth)acrylate compounds having in the molecule at least one ethylene glycol chain and one propylene glycol chain, and trimethylolpropane tri(meth)acrylate compounds having in the molecule at least one ethylene glycol chain and one propylene glycol chain, among which there are preferred polyalkyleneglycol di(meth)acrylates having in the molecule at least one ethylene glycol chain and one propylene glycol chain and 2,2-bis(4-((meth)acryloxypolyalkoxy)phenyl) propanes having in the molecule at least one ethylene glycol chain and one propylene glycol chain. Using such compounds as the photopolymerizing compound will tend to provide particularly excellent balance between adhesion, resolution, tent reliability and stripping property. These compounds may be used alone or in combinations of two or more.

There are no particular restrictions on the photopolymerizing compound having in the molecule at least one ethylene glycol chain and one alkylene glycol chain selected from the group consisting of $C_3$–$C_6$ alkylene glycol chains, so long as it has as alkylene glycol chains in the molecule both an ethylene glycol chain and an alkylene glycol chain selected from the group consisting of $C_3$–$C_6$ alkylene glycol chains, but it preferably has both an ethylene glycol chain and a propylene glycol chain (an n-propylene glycol chain or isopropylene glycol chain). It may also have, in addition to the ethylene glycol chain and propylene glycol chain, also an alkylene glycol chain of about 4–6 carbon atoms, such as an n-butylene glycol chain, isobutylene glycol chain, n-pentylene glycol chain, hexylene glycol chain or a structural isomer thereof.

The total number of repeating units of the alkylene glycol chain in the photopolymerizing compound (preferably a polyalkyleneglycol di(meth)acrylate) is preferably an integer of 5–30, more preferably an integer of 8–23 and even more preferably an integer of 10–15. The tent reliability will tend to be impaired if the total number is less than 5, while the adhesion, resolution and resist shape will tend to be impaired if the number is greater than 30.

According to the invention, the photopolymerizing compound used as component (B) preferably has at least 15 units of $C_2$–$C_6$ alkylene glycols. The number of carbons is preferably 2–6, more preferably 2–5 and even more preferably 2 or 3 from the standpoint of the tenting property and developing solution contamination. The number of units, i.e. the total number of repeating units of $C_2$–$C_6$ alkylene glycol chains is preferably an integer of 15–30, more preferably an integer of 15–25 and even more preferably an integer of 15–20. If the number of units is less than 15, the tenting property (tent reliability) is inferior and the stripping time tends to be longer, while if the number of units is greater than 30, the adhesion, resolution and resist shape tend to be impaired.

According to the invention, a photopolymerizing compound with a molecular weight of 900 or greater is preferably used as component (B), and the molecular weight of the photopolymerizing compound is more preferably 900–2500 and even more preferably 1000–1500. If the molecular weight is less than 900, the tenting property and sensitivity will tend to be inferior and the stripping time will tend to be longer.

In the case of a plurality of ethylene glycol chains and alkylene glycol chains selected from the group consisting of $C_3$–$C_6$ alkylene glycol chains (preferably propylene glycol chains), the plurality of ethylene glycol chains and alkylene glycol chains do not need to be in a continuous block, but may be randomly arranged. For isopropylene glycol chains, the secondary carbon of the propylene group may be bonded to an oxygen atom, and even the primary carbon may be oxygen atom.

As examples of polyalkyleneglycol di(meth)acrylates with at least one ethylene glycol chain and one propylene glycol chain in the molecule there may be mentioned compounds represented by the following general formula (I):

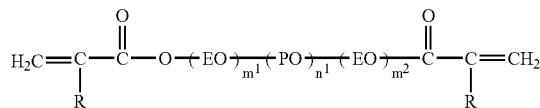

(wherein each R independently represents hydrogen or $C_1$–$C_3$ alkyl group, EO represents an ethylene glycol chain, PO represents a propylene glycol chain and $m^1$, $m^2$ and $n^1$ are integers of 1–30); compounds represented by the following general formula (II):

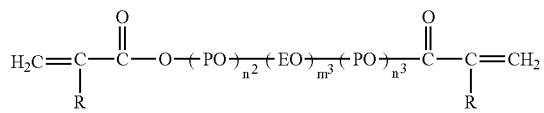

(wherein each R independently represents hydrogen or $C_1$–$C_3$ alkyl group, EO represents an ethylene glycol chain, PO represents a propylene glycol chain and $m^3$, $n^2$ and $n^3$ are integers of 1–30); and compounds represented by the following general formula (III):

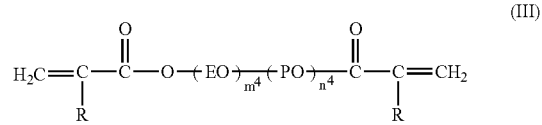

(wherein each R independently represents hydrogen or $C_1$–$C_3$ alkyl group, EO represents an ethylene glycol chain, PO represents a propylene glycol chain and $m^4$ and $n^4$ are integers of 1–30).

These compounds may be used alone or in combinations of two or more.

As examples of 2,2-bis(4-((meth)acryloxypolyalkoxy) phenyl) propanes with at least one ethylene glycol chain and one propylene glycol chain in the molecule there may be mentioned compounds represented by the following general formula (IV):

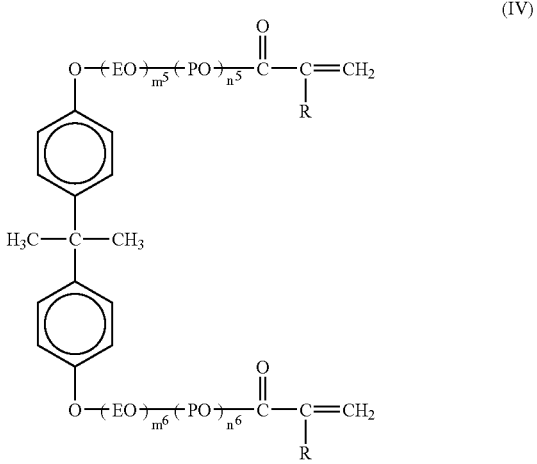

(wherein each R independently represents hydrogen or $C_1$–$C_3$ alkyl group, EO represents an ethylene glycol chain, PO represents a propylene glycol chain and $m^5$, $m^6$, $n^5$ and $n^6$ are integers of 1–30).

As examples of the $C_1$–$C_3$ alkyl groups in general formulas (I), (II), (III) and (IV) above there may be mentioned methyl, ethyl, n-propyl and isopropyl.

The total number of repeating units in the ethylene glycol chain in each of general formulas (I), (II), (III) and (IV) above ($m^1+m^2$, $m^3$, $m^4$ and $m^5+m^6$) is an integer of 1–30, preferably an integer of 1–10, more preferably an integer of 4–9 and even more preferably and integer of 5–8. If the number of repeating units exceeds 30, the tent reliability and resist shape will tend to be impaired.

The total number of repeating units in the propylene glycol chain in each of general formulas (I), (II), (III) and (IV) above ($n^1$, $n^2+n^3$, $n^4$ and $n^5+n^6$) is an integer of 1–30, preferably an integer of 5–20, more preferably an integer of 8–16 and even more preferably an integer of 10–14. If the number of repeating units exceeds 30, the resolution tends to be impaired and more scum (developing solution contamination) tends to be generated.

As a specific example of a compound represented by general formula (I) above there may be mentioned a vinyl compound wherein R=methyl group, $m^1+m^2=4$ (average value) and $n^1=12$ (average value) (product name: FA-023M, by Hitachi Chemical Co., Ltd.).

As specific examples of compounds represented by general formula (II) above there may be mentioned a vinyl compound wherein R=methyl group, $m^3=6$ (average value) and $n^2+n^3=12$ (average value) (product name: FA-024M, by Hitachi Chemical Co., Ltd.), and a vinyl compound wherein R=hydrogen, $m^3=2$ (average value) and $n^2+n^3=4$ (average value) (product name: EP-22, by Dai-ichi Kogyo Seiyaku Co., Ltd.).

As specific examples of compounds represented by general formula (III) above there may be mentioned a vinyl compound wherein R=hydrogen, $m^4=1$ (average value) and $n^4=9$ (average value) (NK ester HEMA-9P, sample by Shin-nakamura Chemical Co., Ltd.), a vinyl compound wherein R=hydrogen, $m^4=10$ (average value) and $n^4=7$ (average value) (product name: APG-400-10E, by Shin-nakamura Chemical Co., Ltd.), a vinyl compound wherein R=hydrogen, $m^4=5$ (average value) and $n^4=7$ (average value) (product name: APG-400-5E, by Shin-nakamura Chemical Co., Ltd.), a vinyl compound wherein R=hydrogen, $m^4=3$ (average value) and $n^4=7$ (average value) (product name: APG-400-3E, by Shin-nakamura Chemical Co., Ltd.), and a vinyl compound wherein R=hydrogen, $m^4=1$ (average value) and $n^4=7$ (average value) (product name: APG-400-1E, by Shin-nakamura Chemical Co., Ltd.).

As examples of 2,2-bis(4-((meth)acryloxypolyethoxypropoxy)phenyl propanes represented by general formula (IV) above there may be mentioned 2,2-bis(4-((meth)acryloxydiethoxyoctapropoxy)phenyl) propane, 2,2-bis(4-((meth)acryloxytetraethoxytetrapropoxy)phenyl) propane and 2,2-bis(4-((meth)acryloxyhexaethoxy-hexapropoxy)phenyl) propane. These may be used alone or in combinations of two or more.

As examples of photopolymerizing compounds other than photopolymerizing compounds having at least one ethylene glycol chain and one propylene glycol chain in the molecule there may be mentioned compounds obtained by reacting α,β-unsaturated carboxylic acids with polyhydric alcohols; bisphenol A-based (meth)acrylate compounds such as 2,2-bis(4-((meth)acryloxypolyethoxy)phenyl) propane and 2,2-bis(4-((meth)acryloxypolypropoxy)phenyl) propane; compounds obtained by reacting α,β-unsaturated carboxylic acids with glycidyl group-containing compounds; urethane monomers such as urethane bond-containing (meth)acrylate compounds; and γ-chloro-β-hydroxypropyl-β'-(meth)acryloyloxyethyl-o-phthalate, β-hydroxyethyl-β'-(meth)acryloyloxyethyl-o-phthalate, β-hydroxypropyl-β'-(meth)acryloyloxyethyl-o-phthalate and (meth)acrylic acid alkyl esters, among which bisphenol A-based (meth)acrylate compounds or urethane bond-containing (meth)acrylate compounds are preferred as essential components. These may be used alone or in combinations of two or more.

As examples of the aforementioned 2,2-bis(4-((meth)acryloxypolyethoxy)phenyl) propanes there may be mentioned 2,2-bis(4-((meth)acryloxydiethoxy)phenyl) propane, 2,2-bis(4-((meth)acryloxytriethoxy)phenyl) propane, 2,2-bis(4-((meth)acryloxytetraethoxy)phenyl) propane, 2,2-bis(4-((meth)acryloxypentaethoxy)phenyl) propane, 2,2-bis(4-((meth)acryloxyhexaethoxy)phenyl) propane, 2,2-bis(4-((meth)acryloxyheptaethoxy)phenyl) propane, 2,2-bis(4-((meth)acryloxyoctaethoxy)phenyl) propane, 2,2-bis(4-((meth)acryloxynonaethoxy)phenyl) propane, 2,2-bis(4-((meth)acryloxydecaethoxy)phenyl) propane, 2,2-bis(4-((meth)acryloxyundecaethoxy)phenyl) propane, 2,2-bis(4-((meth)acryloxydodecaethoxy)phenyl) propane, 2,2-bis(4-((meth)acryloxytridecaethoxy)phenyl) propane, 2,2-bis(4-((meth)acryloxytetradecaethoxy)phenyl) propane, 2,2-bis(4-((meth)acryloxypentadecaethoxy)phenyl) propane and 2,2-bis(4-((meth)acryloxyhexadecaethoxy)phenyl) propane; 2,2-bis(4-(methacryloxypentaethoxy)phenyl) propane is commercially available as BPE-500 (product name of Shin-nakamura Chemical Co., Ltd.), and 2,2-bis(4-(methacryloxypentadecaethoxy)phenyl) propane is commercially available as BPE-1300 (product name of Shin-nakamura Chemical Co., Ltd.). These may be used alone or in combinations of two or more.

The photopolymerization initiator used as component (C) according to the invention will now be explained.

As examples of photopolymerization initiators to be used as component (C) there may be mentioned benzophenone, N,N'-tetraalkyl-4,4'-diaminobenzophenones such as N,N'-tetramethyl-4,4'-diaminobenzophenone (Michler's ketone), aromatic ketones such as 2-benzyl-2-dimethylamino-1-(4-morpholinophenyl)-butanone-1,2-methyl-1-[4-(methylthio)phenyl]-2-morpholino-propanone-1, quinones such as alkyl anthraquinones, benzoin ether compounds such as benzoisoalkyl ethers, benzoin, benzoin compounds such as alkylbenzoins, benzyl derivatives such as benzyldimethylketal, 2,4,5-triarylimidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer and 2-(p-methoxyphenyl)-4,5-diphenylimidazole dimer, acridine derivatives such as 9-phenylacridine and 1,7-bis(9,9'-acridinyl)heptane, N-phenylglycine, N-phenylglycine derivatives, and cumarin based compounds.

The substituents of the aryl groups of the two 2,4,5-triarylimidazoles may be identical to give a symmetrical compound, or they may be different to give a non-symmetrical compound.

From the standpoint of adhesion, resolution and sensitivity, as well as chemical resistance and the resist film properties after photocuring, 2,4,5-triarylimidazole dimers are more preferable. These may be used alone or in combinations of two or more.

From the standpoint of balance between film coatability and photosensitive properties, the content of the binder polymer used as component (A) is preferably 40–80 parts by weight, more preferably 50–70 parts by weight and even more preferably 55–65 parts by weight to 100 parts by weight of the total of component (A) and component (B). The film coatability of the resulting photocuring resin composition tends to be inferior when the content is less than 40 parts by weight, while the photocuring property tends to be insufficient when the content is greater than 80 parts by weight.

The content of the photopolymerizing compound used as component (B) is preferably 20–60 parts by weight, more preferably 30–50 parts by weight and even more preferably 35–45 parts by weight to 100 parts by weight of the total of component (A) and component (B). The photocuring property tends to be insufficient when the content is less than 20 parts by weight, while the film coatability tends to be impaired when the content is greater than 60 parts by weight.

The content of the photopolymerizing compound having in the molecule at least one ethylene glycol chain and one alkylene glycol chain selected from the group consisting of $C_3$–$C_6$ alkylene glycol chains, in component (B), is preferably 10–100 parts by weight, more preferably 25–75 parts by weight and even more preferably 40–60 parts by weight to 100 parts by weight of the total of component (B). When the content is less than 10 parts by weight, the tenting reliability tends to be insufficient.

From the standpoint of balance between sensitivity and resolution, the content of the photopolymerization initiator used as component (C) is preferably 0.01–20 parts by weight, more preferably 0.01–10 parts by weight, even more preferably 0.01–5 parts by weight, yet more preferably 0.05–4 parts by weight and most preferably 0.1–3 parts by weight, to 100 parts by weight of the total of component (A) and component (B). The sensitivity tends to be insufficient when the content is less than 0.01 part by weight, while the resolution tends to be impaired when the content is greater than 20 parts by weight.

The aforementioned photosensitive resin composition may also contain, if necessary, photopolymerizing compounds having in the molecule at least one cationic polymerizable cyclic ether group, cationic polymerization initiators, dyes such as malachite green, tribromophenylsulfone, photocoloring agents such as leuco crystal violet, thermal coloring inhibitors, plasticizers such as p-toluenesulfonamide, pigments, fillers, defoaming agents, flame retardants, stabilizers, tackifiers, leveling agents, desorption accelerators, antioxidants, aromas, imaging agents, thermal crosslinking agents and the like, in an amount of about 0.01–20 parts by weight of each to 100 parts by weight of the total amount of component (A) and component (B). Such additives may be used alone or in combinations of two or more.

The photosensitive resin composition may, if necessary, be dissolved in a solvent such as methanol, ethanol, acetone, methyl ethyl ketone, methyl cellosolve, ethyl cellosolve, toluene, N,N-dimethylformamide or propyleneglycol monomethyl ether, or in a mixture of such solvents, and coated as a solution with a solid portion of approximately 30–60 wt %.

There are no particular restrictions on the use of the photosensitive resin composition, but preferably it is used by coating as a liquid resist onto the surface of a metal such as copper, copper-based alloy, iron, iron-based alloy or the like and drying, and if necessary covering with a protective film, or used in the form of a photosensitive element.

The thickness of the photosensitive resin composition layer will depend on the intended use, but is preferably about 1–100 µm as the post-drying thickness. When used as a liquid resist covered with a protective film, the protective film may be a polymer film such as polyethylene, polypropylene or the like.

The aforementioned photosensitive element may be obtained, for example, by coating and drying the photosensitive resin composition on a polymer film of polyethylene terephthalate, polypropylene, polyethylene, polyester or the like as the support. The coating may be accomplished by a publicly known method using a roll coater, comma coater, gravure coater, air knife coater, die coater, bar coater or the like. The drying may be carried out at 70–150° C. for about 5–30 minutes. The amount of residual organic solvent in the photosensitive resin composition layer is preferably no greater than 2 wt % from the viewpoint of preventing diffusion of the organic solvent in the subsequent steps.

The thickness of each of the polymer films is preferably 1–100 µm. The photosensitive resin composition layer may be laminated on both sides, with one of the polymer films as the support of the photosensitive resin composition and the other polymer film as the protective film of the photosensitive resin composition. The protective film is preferably one such that the adhesive force between the photosensitive resin composition layer and the protective film is lower than the adhesive force between the photosensitive resin composition and the support, and a film with minimal fish-eyes is preferred.

The photosensitive element may also have an intermediate layer or protective layer such as a cushion layer, adhesive layer, light absorbing layer, gas barrier layer or the like, in addition to the photosensitive resin composition layer, support and protective film.

The photosensitive element is stored, for example, after being wound onto a cylindrical core, either directly or after having a protective film further laminated on the other side of the photosensitive resin composition layer. It is preferably wound up in such a manner that the support side faces outward. Edge separators are preferably positioned at the edges of the rolled photosensitive element roll from the standpoint of edge protection, and moisture-resistant edge separators are preferred from the standpoint of edge fusion resistance. The packing method preferably includes packaging by wrapping in a low moisture-permeable black sheet. The winding core may be, for example, a plastic material such as polyethylene resin, polypropylene resin, polystyrene resin, polyvinyl chloride resin, ABS (acrylonitrile-butadiene-styrene copolymer) resin, or the like.

When the photosensitive element having a protective film is used to form a resist pattern, the method may involve first removing the protective film and then laminating the photosensitive resin composition layer onto a circuit-forming board by contact bonding at a pressure of about 0.1–1 MPa (approximately 1–10 kgf/cm²) while heating at about 70–130° C., or alternatively, lamination may be performed under reduced pressure. The lamination surface is usually, but not necessarily, a metal surface.

The laminated photosensitive resin composition layer is then exposed to an active light beam through a negative or positive mask pattern in the form of an image. The light source used for the active light beam may be a publicly known light source that allows effective irradiation of ultraviolet rays or visible light rays, such as a carbon arc lamp, mercury vapor arc lamp, high-pressure mercury lamp, xenon lamp, or the like.

After light exposure, the support is first removed (if a support is present on the photosensitive resin composition layer), and then the unexposed sections are removed by wet developing or dry developing with an alkali aqueous solution, aqueous developing solution, organic solvent or the like as the developing solution, for development to form a resist pattern.

As alkali aqueous solutions there may be mentioned a 0.1–5 wt % sodium carbonate dilute solution, a 0.1–5 wt % potassium carbonate dilute solution or a 0.1–5 wt % sodium hydroxide dilute solution. The pH of such an alkali aqueous solution is preferably in the range of 9–11, and the temperature is regulated so as to be suitable for the developing property of the photosensitive resin composition layer. The alkali aqueous solution may also contain a surfactant, defoaming agent, organic solvent or the like. The developing system employed may be based on, for example, a dip system, spray system, brushing, slapping or the like.

As treatment after development, the resist pattern may be further cured if necessary by heating at about 60–250° C. or by light exposure at about 0.2–10 J/cm². Etching of the metal surface after developing may be accomplished using, for example, a cupric chloride solution, ferric chloride solution, alkali etching solution or the like.

When the photosensitive element of the invention is to be used for fabrication of a printed wiring board, the developed resist pattern is used as a mask and the surface of the circuit-forming board is treated by a publicly known process such as etching or plating. As the plating method there may be employed, for example, copper plating, solder plating, nickel plating, gold plating or the like.

The resist pattern may be then stripped with a more strongly alkali aqueous solution than the alkali aqueous solution used for developing. The stronger alkali aqueous solution may be, for example, a 1–10 wt % sodium hydroxide aqueous solution, a 1–10 wt % potassium hydroxide aqueous solution, or the like. Examples of stripping methods include immersion and spraying. The printed wiring board on which the resist pattern is formed may employ multilayer printed wiring and may also include small-diameter through holes.

EXAMPLES

The present invention will now be explained in further detail through examples and comparative examples which, however, are not intended to be limitative on the invention.

Examples 1–7 and Comparative Examples 1–6

The materials listed in Tables 1 to 6 (component (A), component (B), component (C), additives and solvents) were combined to obtain photosensitive resin composition solutions.

TABLE 1

(units: g)

| | | Example 1 | Example 2 | Example 3 | Comp. Ex. 1 | Comp. Ex. 2 |
|---|---|---|---|---|---|---|
| Component (A) | methacrylic acid/methyl methacrylate/ethyl acrylate = 20/50/30 (wt. ratio); wt.-av. mol. wt. = 80,000; 40 wt % methyl cellosolve/toluene = 6/4 (wt. ratio) solution; dispersity = 4 | 150 (solid portion: 60) | 150 (solid portion: 60) | — | 150 (solid portion: 60) | — |
| | methacrylic acid/methyl methacrylate/ethyl acrylate = 20/50/30 (wt. ratio); wt.-av. mol. wt. = 80,000; 40 wt % methyl cellosolve/toluene = 6/4 (wt. ratio) solution; dispersity = 2 | — | — | 75 (solid portion: 30) | — | 75 (solid portion: 30) |
| | methacrylic acid/methyl methacrylate/ethyl acrylate = 20/50/30 (wt. ratio); wt.-av. mol. wt. = 30,000; 40 wt % methyl cellosolve/toluene = 6/4 (wt. ratio) solution; dispersity = 2 | — | — | 75 (solid portion: 30) | — | 75 (solid portion: 30) |
| | Dispersity of component (A) | 4 | 4 | 4 | 4 | 4 |

TABLE 2

(units: g)

| | | Example 1 | Example 2 | Example 3 | Comp. Ex. 1 | Comp. Ex. 2 |
|---|---|---|---|---|---|---|
| Component (B) | FA-024M *1 | 20 | — | 20 | — | — |
| | Sample 1 *2 | — | 20 | — | — | — |
| | 2,2-bis((4-methacryloxypentaethoxy)phenyl)propane | 20 | 20 | 20 | 40 | 40 |
| Component (C) | 2-(o-chlorophenyl)-4,5-diphenylimidazole dimer | 3.0 | 3.0 | 3.0 | 3.0 | 3.0 |

TABLE 2-continued

| | | Example 1 | Example 2 | Example 3 | Comp. Ex. 1 | Comp. Ex. 2 |
|---|---|---|---|---|---|---|
| | | | | | | (units: g) |
| | N,N-tetraethyl-4,4'-diaminobenzophenone | 0.15 | 0.15 | 0.15 | 0.15 | 0.15 |
| Additives | Leuco crystal violet | 0.5 | 0.5 | 0.5 | 0.5 | 0.5 |
| | Malachite green | 0.05 | 0.05 | 0.05 | 0.05 | 0.05 |
| | p-toluenesulfonamide | 4.0 | 4.0 | 4.0 | 4.0 | 4.0 |
| Solvents | Acetone | 10.0 | 10.0 | 10.0 | 10.0 | 10.0 |
| | Toluene | 10.0 | 10.0 | 10.0 | 10.0 | 10.0 |
| | Methanol | 3.0 | 3.0 | 3.0 | 3.0 | 3.0 |
| | Dimethylformamide | 3.0 | 3.0 | 3.0 | 3.0 | 3.0 |

TABLE 3

| | | Example 4 | Example 5 | Example 6 | Example 7 |
|---|---|---|---|---|---|
| | | | | | (units: g) |
| Component (A) | methacrylic acid/methyl methacrylate/ethyl acrylate = 20/50/30 (wt. ratio); wt.-av. mol. wt. = 80,000; 40 wt % methyl cellosolve/toluene = 6/4 (wt. ratio) solution; dispersity = 3 | 150 (solid portion: 60) | — | — | — |
| | methacrylic acid/methyl methacrylate/ethyl acrylate = 20/50/30 (wt. ratio); wt.-av. mol. wt. = 80,000; 40 wt % methyl cellosolve/toluene = 6/4 (wt. ratio) solution; dispersity = 5 | — | 150 (solid portion: 60) | — | — |
| | methacrylic acid/methyl methacrylate/ethyl acrylate = 20/50/30 (wt. ratio); wt.-av. mol. wt. = 80,000; 40 wt % methyl cellosolve/toluene = 6/4 (wt. ratio) solution; dispersity = 4 | — | — | 150 (solid portion: 60) | 150 (solid portion: 60) |
| | Dispersity of component (A) | 3 | 5 | 4 | 4 |

TABLE 4

| | | Example 4 | Example 5 | Example 6 | Example 7 |
|---|---|---|---|---|---|
| | | | | | (units: g) |
| Component (B) | FA-024M *1 | 20 | 20 | — | — |
| | Sample 1 *2 | — | — | — | — |
| | 2,2-bis((4-methacryloxypentaethoxy)phenyl)propane | 20 | 20 | 20 | 20 |
| | FA-023M *3 | — | — | 20 | — |
| | Sample 2 *4 | — | — | — | 20 |
| Component (C) | 2-(o-chlorophenyl)-4,5-diphenylimidazole dimer | 3.0 | 3.0 | 3.0 | 3.0 |
| | N,N-tetraethyl-4,4'-diaminobenzophenone | 0.15 | 0.15 | 0.15 | 0.15 |
| Additives | Leuco crystal violet | 0.5 | 0.5 | 0.5 | 0.5 |
| | Malachite green | 0.05 | 0.05 | 0.05 | 0.05 |
| | p-toluenesulfonamide | 4.0 | 4.0 | 4.0 | 4.0 |
| Solvents | Acetone | 10.0 | 10.0 | 10.0 | 10.0 |
| | Toluene | 10.0 | 10.0 | 10.0 | 10.0 |
| | Methanol | 3.0 | 3.0 | 3.0 | 3.0 |
| | Dimethylformamide | 3.0 | 3.0 | 3.0 | 3.0 |

TABLE 5

| | | Comp. Ex. 3 | Comp. Ex. 4 | Comp. Ex. 5 | Comp. Ex. 6 |
|---|---|---|---|---|---|
| | | | | | (units: g) |
| Component (A) | methacrylic acid/methyl methacrylate/ethyl acrylate = 20/50/30 (wt. ratio); wt.-av. | — | — | — | — |

TABLE 5-continued (units: g)

| | Comp. Ex. 3 | Comp. Ex. 4 | Comp. Ex. 5 | Comp. Ex. 6 |
|---|---|---|---|---|
| mol. wt. = 80,000; 40 wt % methyl cellosolve/toluene = 6/4 (wt. ratio) solution; dispersity = 4 | | | | |
| methacrylic acid/methyl methacrylate/ethyl acrylate = 20/50/30 (wt. ratio); wt.-av. mol. wt. = 80,000; 40 wt % methyl cellosolve/toluene = 6/4 (wt. ratio) solution; dispersity = 2 | 150 (solid portion: 60) | — | 150 (solid portion: 60) | — |
| methacrylic acid/methyl methacrylate/ethyl acrylate = 20/50/30 (wt. ratio); wt.-av. mol. wt. = 30,000; 40 wt % methyl cellosolve/toluene = 6/4 (wt. ratio) solution; dispersity = 2 | — | 150 (solid portion: 60) | — | 150 (solid portion: 60) |
| Dispersity of component (A) | 2 | 2 | 2 | 2 |

TABLE 6

(units: g)

| | | Comp. Ex. 3 | Comp. Ex. 4 | Comp. Ex. 5 | Comp. Ex. 6 |
|---|---|---|---|---|---|
| Component (B) | FA-024M *1 | 20 | 20 | — | — |
| | Sample 1 *2 | — | — | — | — |
| | 2,2-bis((4-methacryloxypentaethoxy) phenyl)propane | 20 | 20 | 40 | 40 |
| Component (C) | 2-(o-chlorophenyl)-4,5-diphenylimidazole dimer | 3.0 | 3.0 | 3.0 | 3.0 |
| | N,N-tetraethyl-4,4'-diaminobenzophenone | 0.15 | 0.15 | 0.15 | 0.15 |
| Additives | Leuco crystal violet | 0.5 | 0.5 | 0.5 | 0.5 |
| | Malachite green | 0.05 | 0.05 | 0.05 | 0.05 |
| | p-toluenesulfonamide | 4.0 | 4.0 | 4.0 | 4.0 |
| Solvents | Acetone | 10.0 | 10.0 | 10.0 | 10.0 |
| | Toluene | 10.0 | 10.0 | 10.0 | 10.0 |
| | Methanol | 3.0 | 3.0 | 3.0 | 3.0 |
| | Dimethylformamide | 3.0 | 3.0 | 3.0 | 3.0 |

The components (B) used in Tables 2, 4 and 6 were as follows.

1: A vinyl compound of general formula (II) wherein R=methyl group, $m^3=6$ (average value) and $n^2+n^3=12$ (average value) (product name: FA-024M, by Hitachi Chemical Co., Ltd.; molecular weight=1282, number of $C_2$–$C_6$ alkylene glycol units=18).

2: A vinyl compound of general formula (IV) wherein R=methyl group, $m^5+m^6=16$ (average value) and $n^5+n^6=5$ (average value) (sample by Hitachi Chemical Co., Ltd.; molecular weight=1358, number of $C_2$–$C_6$ alkylene glycol units=21).

3: A vinyl compound of general formula (I) wherein R=methyl group, $m^1+m^2=4$ (average value) and $n^1=12$ (average value) (product name: FA-023M, by Hitachi Chemical Co., Ltd.; molecular weight=1194, number of $C_2$–$C_6$ alkylene glycol units=16).

4: A vinyl compound of general formula (III) wherein R=methyl group, $m^4=6$ (average value) and $n^4=12$ (average value) (sample by Hitachi Chemical Co., Ltd.; molecular weight=1282, number of $C_2$–$C_6$ alkylene glycol units=18).

A knife coating method was then used to evenly apply the photosensitive resin compositions obtained above onto 19 µm-thick polyethylene terephthalate films (product name: G2-19, Teijin Co., Ltd.), and then drying was performed for 10 minutes with a hot-air convection drier at 100° C. to obtain photosensitive elements. The film thickness of each of the photosensitive resin composition layers after drying was 40 µm.

Next, the copper surface of a copper-clad laminate (product name: MCL-E-679, product of Hitachi Chemical Co., Ltd.) composed of a glass epoxy material laminated on both sides with copper foil (35 µm thickness) was polished using a polishing machine with a #600 equivalent brush (product of Sankei Co., Ltd.), and after cleaning with water and drying with an air current, the obtained copper-clad laminate was heated to 80° C. and then each of the photosensitive elements obtained earlier was used for lamination of the photosensitive resin composition layer onto the copper surface at 110° C., 0.4 MPa.

The copper-clad laminate was cooled after lamination, and when the temperature of the copper-clad laminate reached 23° C., a phototool (a phototool having a Stouffer 21-step tablet and a wiring pattern with a line width/space width of 30 µm/400 µm to 200 µm/400 µm) was adhered to the polyethylene terephthalate side and an exposure apparatus by Oak Seisakusho Co., Ltd. (Model HMW-201GX, 5 kW superhigh pressure mercury lamp) was used for light exposure at an energy dose giving 8.0 residual step levels after developing of the Stouffer 21-step tablet.

After exposure, it was allowed to stand for 15 minutes at room temperature, and then the polyethylene terephthalate film was stripped from the copper-clad laminate and development was performed by spraying a 1.0 wt % sodium carbonate aqueous solution at 30° C. After developing, the pattern section with a line width/space width of 100 μm/400 μm was observed using a scanning electron microscope (300×), and the area of pitting generated in the resist wall at the interface between the resist and the copper surface was measured. The area of pitting generated in the resist wall was recorded as the mousebite rate, giving the results are shown in Table 7. A smaller mousebite rate indicates a more satisfactory resist shape.

The tent reliability was evaluated by the following procedure. The aforementioned photosensitive element was laminated (110° C., 0.4 MPa) onto both sides of a 1.6 mm-thick copper-clad laminate substrate having 24 holes each at 3.0 mmφ, 3.5 mmφ, 4.0 mmφ, 4.5 mmφ, 5.0 mmφ, 5.5 mmφ and 6.0 mmφ, and this was exposed at the aforementioned energy dose (light exposure giving 8.0 residual step levels after developing), after which developing was performed twice for 60 seconds (spraying a 1.0 wt % sodium carbonate aqueous solution at 30° C.). After developing, the numbers of tears in the photosensitive resin composition layer at the sections of the 3.0 mmφ, 3.5 mmφ, 4.0 mmφ, 4.5 mmφ, 5.0 mmφ, 5.5 mmφ and 6.0 mmφ holes were counted. The tent tearing rate was measured from the number of tears in the photosensitive resin composition layer at the hole sections (see formula (1) below), giving the results shown in Table 7. A smaller tent tearing rate indicates more excellent tent reliability.

Tent tearing rate (%)=(number of tears in photosensitive resin composition layer at hole sections/168)×100 (1)

The stripping property was also evaluated by the following procedure. The copper surface of a copper-clad laminate (product name: MCL-E-679, product of Hitachi Chemical Co., Ltd.) composed of a glass epoxy material laminated on both sides with copper foil (35 μm thickness) was polished using a polishing machine with a #600 equivalent brush (product of Sankei Co., Ltd.), and after cleaning with water and drying with an air current, the obtained copper-clad laminate was heated to 80° C. and then each of the photosensitive elements obtained earlier was used for lamination of the photosensitive resin composition layer onto the copper surface at 110° C., 0.4 MPa.

The copper-clad laminate was cooled after lamination, and when the temperature of the copper-clad laminate reached 23° C., an exposure apparatus by Oak Seisakusho Co., Ltd. (Model HMW-201GX, 5 kW superhigh pressure mercury lamp) was used, without a phototool, for light exposure at an energy dose giving 8.0 residual step levels after developing of the Stouffer 21-step tablet (total surface exposure).

After exposure, it was allowed to stand for 15 minutes at room temperature, and then the polyethylene terephthalate film was stripped from the copper-clad laminate and development was performed by spraying a 1.0 wt % sodium carbonate aqueous solution at 30° C. The developed substrate was cut to a rectangular size of 70 mm×50 mm to prepare a sample for evaluation of the stripping property. The stripping property evaluation sample was immersed in a beaker containing a 3 wt % sodium hydroxide aqueous solution at 50° C., and the strip shape of the photosensitive resin composition layer peeled from the copper surface was observed after 30 seconds of stirring. The shape (size) of the photosensitive resin composition layer when stripped from the copper surface was recorded as the strip shape, giving the results shown in Table 7. A smaller strip size indicates a more excellent stripping property.

TABLE 7

| | Mousebite rate (%) | Tent tearing rate (%) | Strip shape (mm) |
|---|---|---|---|
| Example 1 | 0 | 0 | 20 |
| Example 2 | 0 | 0 | 25 |
| Example 3 | 0 | 0 | 20 |
| Example 4 | 0 | 0 | 25 |
| Example 5 | 0 | 0 | 15 |
| Example 6 | 0 | 0 | 25 |
| Example 7 | 0 | 0 | 20 |
| Comp. Ex. 1 | 0 | 10 | 25 |
| Comp. Ex. 2 | 0 | 10 | 25 |
| Comp. Ex. 3 | 0 | 0 | 50 |
| Comp. Ex. 4 | 50 | 40 | 15 |
| Comp. Ex. 5 | 0 | 10 | 55 |
| Comp. Ex. 6 | 60 | 60 | 20 |

As clearly seen from the results shown in Table 7, the photosensitive resin compositions used in Comparative Examples 1 and 2 had poor tent reliability. The photosensitive resin composition used in Comparative Example 3 exhibited a poor stripping property. The photosensitive resin compositions used in Comparative Examples 4 and 6 had poor resist shapes and tent reliabilities. The photosensitive resin composition used in Comparative Example 5 had poor tent reliability and stripping property.

In contrast, the photosensitive resin compositions used in Examples 1 to 7 exhibited excellent resist shapes, tent reliabilities and stripping properties.

Industrial Applicability

As explained above, the photosensitive resin composition and photosensitive element according to the invention can achieve high-level characteristics with a satisfactory balance between resist shape, tent reliability and stripping property. The photosensitive resin composition and photosensitive element of the invention are therefore useful for high densification of printed wiring and automation of printed wiring board fabrication.

Furthermore, the resist pattern forming method and printed wiring board fabrication method according to the invention employ a photosensitive resin composition or photosensitive element according to the invention which exhibit excellent balance between the properties of resist shape, tent reliability and stripping property, and therefore allow higher densification of printed wiring and more efficient automation of printed wiring board fabrication.

What is claimed is:

1. A photosensitive resin composition comprising (A) a binder polymer, (B) a photopolymerizing compound having at least one ethylenic unsaturated bond in the molecule and (C) a photopolymerization initiator, wherein the binder polymer as component (A) comprises two or more binder polymers and the photopolymerizing compound as component (B) has in the molecule at least one ethylene glycol chain and at least one alkylene glycol chain selected from the group consisting of $C_3$–$C_6$ alkylene glycol chains.

2. A photosensitive resin composition of the invention comprising (A) a binder polymer, (B) a photopolymerizing compound having at least one ethylenic unsaturated bond in the molecule and (C) a photopolymerization initiator, wherein the binder polymer as component (A) has a dispersity of 2.5–6.0 and the photopolymerizing compound as component (B) has in the molecule at least one ethylene glycol chain and at least one alkylene glycol chain selected from the group consisting of $C_3$–$C_6$ alkylene glycol chains.

3. A photosensitive resin composition according to claim 1, wherein the photopolymerizing compound as component (B) has at least 15 $C_2$–$C_6$ alkylene glycol units.

4. A photosensitive resin composition according to claim 1, wherein the photopolymerizing compound as component (B) has a molecular weight of 900 or greater.

5. A photosensitive resin composition according to claim 1, wherein the photopolymerizing compound as component (B) has at least one ethylene glycol chain and at least one propylene glycol chain in the molecule.

6. A photosensitive resin composition according to claim 1, wherein the binder polymer as component (A) contains at least one selected from the group consisting of styrene and styrene derivatives, as an essential copolymerizing component.

7. A photosensitive resin composition according to claim 1, wherein the photopolymerizing compound as component (B) is a polyalkyleneglycol di(meth)acrylate.

8. A photosensitive resin composition according to claim 1, wherein the photopolymerizing compound as component (B) is a 2,2-bis(4-((meth)acryloxypolyalkoxy)phenyl)propane.

9. A photosensitive resin composition according to claim 1, wherein the photopolymerization initiator as component (C) contains a 2,4,5-triarylimidazole dimer as an essential component.

10. A photosensitive element prepared by coating and drying a photosensitive resin composition according to claim 1 onto a support.

11. A resist pattern forming method wherein a photosensitive element according to claim 10 is laminated onto a circuit forming board with the photosensitive resin composition layer bonded thereto and is irradiated with an activating light beam in an image pattern for photocuring of the exposed sections, and the unexposed sections are removed by development.

12. A printed wiring board fabrication method wherein a circuit forming board on which a resist pattern has been formed by a resist pattern forming method according to claim 11 is subjected to etching treatment or plating treatment.

13. A photosensitive resin composition according to claim 2, wherein the photopolymerizing compound as component (B) has at least 15 $C_2$–$C_6$ alkylene glycol units.

14. A photosensitive resin composition according to claim 2, wherein the photopolymerizing compound as component (B) has a molecular weight of 900 or greater.

15. A photosensitive resin composition according to claim 3, wherein the photopolymerizing compound as component (B) has a molecular weight of 900 or greater.

16. A photosensitive resin composition according to claim 2, wherein the photopolymerizing compound as component (B) has at least one ethylene glycol chain and at least one propylene glycol chain in the molecule.

17. A photosensitive resin composition according to claim 3, wherein the photopolymerizing compound as component (B) has at least one ethylene glycol chain and at least one propylene glycol chain in the molecule.

18. A photosensitive resin composition according to claim 4, wherein the photopolymerizing compound as component (B) has at least one ethylene glycol chain and at least one propylene glycol chain in the molecule.

19. A photosensitive resin composition according to claim 2, wherein the binder polymer as component (A) contains at least one selected from the group consisting of styrene and styrene derivatives, as an essential copolymerizing component.

20. A photosensitive resin composition according to claim 3, wherein the binder polymer as component (A) contains at least one selected from the group consisting of styrene and styrene derivatives, as an essential copolymerizing component.

21. A photosensitive resin composition according to claim 4, wherein the binder polymer as component (A) contains at least one selected from the group consisting of styrene and styrene derivatives, as an essential copolymerizing component.

22. A photosensitive resin composition according to claim 5, wherein the binder polymer as component (A) contains at least one selected from the group consisting of styrene and styrene derivatives, as an essential copolymerizing component.

23. A photosensitive resin composition according to claim 2, wherein the photopolymerizing compound as component (B) is a polyalkyleneglycol di(meth)acrylate.

24. A photosensitive resin composition according to claim 3, wherein the photopolymerizing compound as component (B) is a polyalkyleneglycol di(meth)acrylate.

25. A photosensitive resin composition according to claim 4, wherein the photopolymerizing compound as component (B) is a polyalkyleneglycol di(meth)acrylate.

26. A photosensitive resin composition according to claim 5, wherein the photopolymerizing compound as component (B) is a polyalkyleneglycol di(meth)acrylate.

27. A photosensitive resin composition according to claim 6, wherein the photopolymerizing compound as component (B) is a polyalkyleneglycol di(meth)acrylate.

28. A photosensitive resin composition according to claim 2, wherein the photopolymerizing compound as component (B) is a 2,2-bis(4-((meth)acryloxypolyalkoxy)phenyl)propane.

29. A photosensitive resin composition according to claim 3, wherein the photopolymerizing compound as component (B) is a 2,2-bis(4-((meth)acryloxypolyalkoxy)phenyl)propane.

30. A photosensitive resin composition according to claim 4, wherein the photopolymerizing compound as component (B) is a 2,2-bis(4-((meth)acryloxypolyalkoxy)phenyl)propane.

31. A photosensitive resin composition according to claim 5, wherein the photopolymerizing compound as component (B) is a 2,2-bis(4-((meth)acryloxypolyalkoxy)phenyl)propane.

32. A photosensitive resin composition according to claim 6, wherein the photopolymerizing compound as component (B) is a 2,2-bis (4-((meth)acryloxypolyalkoxy)phenyl)propane.

33. A photosensitive resin composition according to claim 2, wherein the photopolymerization initiator as component (C) contains a 2,4,5-triarylimidazole dimer as an essential component.

34. A photosensitive resin composition according to claim 3, wherein the photopolymerization initiator as component (C) contains a 2,4,5-triarylimidazole dimer as an essential component.

35. A photosensitive resin composition according to claim 4, wherein the photopolymerization initiator as component (C) contains a 2,4,5-triarylimidazole dimer as an essential component.

36. A photosensitive resin composition according to claim 5, wherein the photopolymerization initiator as component (C) contains a 2,4,5-triarylimidazole dimer as an essential component.

37. A photosensitive resin composition according to claim 6, wherein the photopolymerization initiator as component (C) contains a 2,4,5-triarylimidazole dimer as an essential component.

38. A photosensitive resin composition according to claim 7, wherein the photopolymerization initiator as component (C) contains a 2,4,5-triarylimidazole dimer as an essential component.

39. A photosensitive resin composition according to claim 8, wherein the photopolymerization initiator as component (C) contains a 2,4,5-triarylimidazole dimer as an essential component.

40. A photosensitive element prepared by coating and drying a photosensitive resin composition according to claim 2 onto a support.

41. A photosensitive element prepared by coating and drying a photosensitive resin composition according to claim 3 onto a support.

42. A photosensitive element prepared by coating and drying a photosensitive resin composition according to claim 4 onto a support.

43. A photosensitive element prepared by coating and drying a photosensitive resin composition according to claim 5 onto a support.

44. A photosensitive element prepared by coating and drying a photosensitive resin composition according to claim 6 onto a support.

45. A photosensitive element prepared by coating and drying a photosensitive resin composition according to claim 7 onto a support.

46. A photosensitive element prepared by coating and drying a photosensitive resin composition according to claim 8 onto a support.

47. A photosensitive element prepared by coating and drying a photosensitive resin composition according to claim 9 onto a support.

* * * * *